United States Patent [19]
Leong et al.

[11] Patent Number: 5,963,364
[45] Date of Patent: *Oct. 5, 1999

[54] MULTI-WAVELENGTH VARIABLE ATTENUATOR AND HALF WAVE PLATE

[75] Inventors: Tony P. Leong, San Jose; Edward S. North, Los Altos; Richard Linsley Herbst, Palo Alto, all of Calif.

[73] Assignee: New Wave Research, Sunnyvale, Calif.

[*] Notice: This patent is subject to a terminal disclaimer.

[21] Appl. No.: 08/949,962

[22] Filed: Oct. 14, 1997

Related U.S. Application Data

[60] Continuation of application No. 08/455,509, May 31, 1995, Pat. No. 5,703,713, which is a division of application No. 08/199,389, Feb. 18, 1994, Pat. No. 5,611,946.

[51] Int. Cl.$^6$ ...................................................... G02B 5/30
[52] U.S. Cl. ........................ 359/352; 359/494; 359/495; 359/500
[58] Field of Search .................................... 359/352, 494, 359/495, 499, 501, 500, 498, 497

[56] References Cited

U.S. PATENT DOCUMENTS

| | | |
|---|---|---|
| 2,347,582 | 4/1944 | Ulffers . |
| 2,637,243 | 5/1953 | Marx . |
| 3,137,784 | 6/1964 | Kasemann . |
| 3,436,545 | 4/1969 | Richards et al. . |
| 3,439,974 | 4/1969 | Henry et al. . |
| 3,770,336 | 11/1973 | Roess . |
| 3,782,823 | 1/1974 | Kantorski et al. . |
| 3,897,136 | 7/1975 | Bryngdahl . |
| 3,936,147 | 2/1976 | Murakami . |
| 4,141,456 | 2/1979 | Hart . |
| 4,182,024 | 1/1980 | Cometta . |
| 4,229,710 | 10/1980 | Shoshan . |

(List continued on next page.)

FOREIGN PATENT DOCUMENTS

| | | |
|---|---|---|
| 4029530 | 3/1992 | Germany . |
| 62-124086 | 6/1987 | Japan . |
| 63-154280 | 6/1988 | Japan . |
| 1-192492 | 8/1989 | Japan . |
| 2-192885 | 7/1990 | Japan . |
| 5-192779 | 8/1993 | Japan . |
| 6-106378 | 4/1994 | Japan . |

OTHER PUBLICATIONS

Product Literature, "for Profile Analysis Sample Preparation Suss Manual Scribers", Karl Suss America, Inc., Waterbury Center, Vermont.

Product Literature, "Excimer Laser Cutter Attachment", Model LCM–308, by Florod Corporation, Gardena, California.

Mielenz et al., "Accuracy of Polarization Attenuators", Applied Optics, vol. 11, No. 3, Mar. 1972, pp. 594–602.

*Primary Examiner*—Cassandra Spyrou
*Assistant Examiner*—Craig Curtis
*Attorney, Agent, or Firm*—David J. Weitz; Wilson Sonsini Goodrich & Rosati

[57] ABSTRACT

A probe station which comprises a base machine, a chuck mounted on the base machine to hold a device under test (DUT), a probe platen mounted on the base machine on which to mount probes for the device, a microscope mounted on the base machine having a field of view on the DUT on the chuck, and a single laser, mounted with the microscope. The single laser supplies an output beam in a plurality of wavelengths through the microscope optics on a beam line to the field of view of the microscope. The laser system includes a solid state laser, a harmonic generator coupled with the solid state laser, and switchable optics for selecting the wavelength of the output beam from among two or more selectable wavelengths. In addition, the laser system includes a variable attenuator, based on a unique half-wave plate, which operates for the plurality of wavelengths which are selectable as outputs in the infrared (1064 nanometers), in the green (532 nanometers), and in the ultraviolet (355 nanometers, or 266 nanometers). These wavelengths correspond to the fundamental output wavelength of the Nd:YAG laser, the second harmonic, and either the third or fourth harmonic of the laser.

15 Claims, 5 Drawing Sheets

U.S. PATENT DOCUMENTS

| | | |
|---|---|---|
| 4,346,314 | 8/1982 | Craxton . |
| 4,530,600 | 7/1985 | Lopez . |
| 4,575,247 | 3/1986 | Tansey ................................. 356/349 |
| 4,580,269 | 4/1986 | Salour et al. ........................... 372/94 |
| 4,778,263 | 10/1988 | Foltyn . |
| 4,879,479 | 11/1989 | Frazier et al. . |
| 4,976,930 | 12/1990 | Kishida et al. . |
| 5,047,668 | 9/1991 | Bosenberg . |
| 5,059,764 | 10/1991 | Baer . |
| 5,083,007 | 1/1992 | Spletter et al. . |
| 5,144,630 | 9/1992 | Lin . |
| 5,151,909 | 9/1992 | Davenport et al. . |
| 5,191,392 | 3/1993 | Johnson . |
| 5,227,607 | 7/1993 | Ishiyama . |
| 5,231,263 | 7/1993 | Kuwabara et al. . |
| 5,247,389 | 9/1993 | Beausoleil . |
| 5,266,889 | 11/1993 | Harwood et al. . |
| 5,341,236 | 8/1994 | Stappaerts . |
| 5,361,275 | 11/1994 | Opower . |
| 5,365,034 | 11/1994 | Kawamura et al. . |
| 5,519,724 | 5/1996 | Tatah . |

MULTI-WAVELENGTH VARIABLE ATTENUATOR AND HALF WAVE PLATE

This application is a continuation of application Ser. No. 08/455,509, filed May 31, 1995, now U.S. Pat. No. 5,703, 713, which is a divisional application of application Ser. No. 08/199,389, filed Feb. 18, 1994, now U.S. Pat. No. 5,611, 946.

BACKGROUND OF THE INVENTION

1. Field of the Invention

The present invention relates to analytical probe stations, such as used in semiconductor manufacturing and testing procedures, laser cutters used standing alone or with the probe stations, and to multi-wavelength laser systems suitable for use in this environment.

2. Description of Related Art

Analytical probe stations are in widespread use in semiconductor manufacturing and design facilities. When a design engineer or failure analyst has to debug a circuit, it is most often done with the aid of an analytic-probe station. The probe stations typically include a base machine with a platen for mounting probes, probes for positioning on the platen, a chuck or chucks on which to mount a semiconductor or other subject of the probe station, a microscope bridge to support a microscope, and a microscope mounted on the microscope bridge. The probes contain microscopic probe needles which are used to check signals and make measurements at various locations in the integrated circuit.

The microscope has a field of view on the subject of the probe, so that a scientist or engineer can probe a semiconductor device or other component under direct visualization. A representative system is known as the SUSS PM 5 laboratory prober manufactured by Karl Suss, Waterbury Center, Vt. The laboratory prober is typically available with a variety of microscopes, including relatively low magnification stereoscopic systems to extremely high magnification probing microscopes.

Such probe stations are often used for analysis of integrated circuits, or other devices like liquid crystal display (LCD) panels, which comprise a plurality of layers of material. For instance, an integrated circuit may be formed on a semiconductor, with one or more polysilicon layers, one or more oxide or isolation layers, and one or more metal layers.

To be able to probe an integrated circuit, the protective passivation layer must be removed. This may be done using an ultrasonic cutter, a sturdy probe tip (by scratching), a plasma or chemical etching process, a focused ion beam system, or a laser system. The laser is pulsed through the microscope and can remove the passivation material to enable the engineer to probe the circuit. The laser may also be used to cut circuit lines to isolate or modify a circuit.

Similarly, in the manufacturing process for large-scale LCDs, shorts may appear at various locations. Since large LCDs are expensive, it is economical to repair these shorts. A laser is used to remove the short by focusing enough energy density on the short material to vaporize it. LCDs typically use indium tin oxide (ITO) for the nearly invisible conducting lines on the LCD screen. Chrome is also used on the borders as conductive buses. A color filter is used in color LCDs. The color filter material may also have manufacturing defects which can be repaired. ITO, chrome, and various color filter shorts may be repaired with a laser system.

Accordingly, some probe stations in the prior art have been coupled to lasers. One typical system in the prior art is known as the Xenon Laser Cutter, Model No. SUSS XLC. This system utilizes a pulsed xenon laser source which is directed to the device under test through special optics coupled with a high magnification microscope. The predominant wavelength of this system is in the green optical region, so it passes readily through the microscope optics. This single wavelength system is quite complex. The xenon laser must be mounted with the microscope, such that the output of the xenon laser is directed through the microscope optics. In a probe station environment, which already involves a large amount of instrumentation, the addition of a laser system makes the station much larger and more complicated. In addition, the expense of such laser systems has been quite high.

One limitation of a laser cutter system for a probe station which generates a single wavelength, is that the single wavelength may not be appropriate for cutting off certain types of layers of material. For instance, semiconductors typically have aluminum lines deposited on silicon wafers. There may be one, two, three, or four layers of metal lines separated by interlayer dielectrics. The whole device is then coated with a non-conductive passivation material to protect the circuit. The metal lines are typically aluminum, but may also be gold or titanium-tungsten. The passivation materials are typically silicon dioxide, silicon nitride, and polyimide.

In the semiconductor failure analysis market, the most universal wavelength is in the green region. Most metals absorb green laser energy very well and are usually very easily cut with one pulse. The green wavelength may be generated with a xenon laser, or with a frequency doubled Nd:YAG system. Most passivation materials are transparent to visible light as well as green laser energy. To remove passivation material which does not absorb green energy, one must heat up the underlying metal to a temperature which will "blow out" the passivation material. This can usually be accomplished if the underlying metal is of sufficient mass which will not vaporize when the laser pulse hits. It becomes very difficult to remove certain passivation materials such as nitride and polyimide when the metal line is small, or if one is trying to access a metal layer underlying a top metal layer, or the underlying material is silicon or polysilicon.

Certain passivation materials, specifically nitride and polyimide, can be removed directly with ultraviolet energy. These materials absorb UV energy directly and are slowly ablated using multiple low energy UV laser pulses. Unfortunately, silicon dioxide is not absorbing of most UV wavelengths (except for around 200 nanometers) and must be removed indirectly using the heating method described above. Infrared laser energy is widely used in the flat panel display repair market. Most of the materials used in this market absorb infrared wavelengths. However, some materials, such as chromium, and some color filter materials are more absorbing of the green wavelength. In this market, all of the material in the target area must be removed, and the cuts are usually relatively large, i.e., 5–40 microns.

The infrared wavelength also has application in the semiconductor analysis field. Silicon is generally transparent to infrared energy. This allows one to remove metal lines with less damage to the underlying silicon with infrared than can be accomplished with green energy. Using green energy, the cut line can short to the substrate because of heating of the silicon. This happens less often with infrared, making it an excellent complementary wavelength to green for semiconductor failure analysis.

The following table summarizes performance for some wavelengths on common materials.

| 1064 nm (infrared) | 532 nm (green) | 355 nm (ultraviolet) |
|---|---|---|
| ITO | ITO | Nitride |
| Chromium | Chromium | Polyimide |
| Color filter | Color filter | |
| | Silicon Dioxide | |
| | Nitride | |
| | Polyimide (big cuts) | |
| | SOG | |
| | Poly-silicon | |
| | Gold | |
| | Aluminum | |
| | Tungsten | |

However, the prior art has been unable to provide two wavelengths of light from a single laser system. Thus, the probe station or laser cutter which is capable of supplying more than one wavelength of light has used two or more separate laser systems, becoming very large and unwieldy. For instance, one prior art system has combined an excimer laser which supplies ultraviolet with a doubled YAG laser on a single probe station, such as a combination of the model LCM-308 EXCIMER LASER CUTTER ATTACHMENT with the laser of the model LCP GREEN YAG LASER CUTTER, both manufactured by Florod Corp. of Gardena, Calif. However, the excimer laser is a large bulky device, requiring complicated tubular wave guides to deliver the laser energy to the microscope optics. This system is very expensive and uses up valuable laboratory space.

Accordingly, there is a need for a multi-wavelength laser system for use with a probe station or laser cutter, which is economical, small in size, and efficient.

SUMMARY OF THE INVENTION

The present invention provides a probe station which comprises a base machine, a chuck mounted on the base machine to hold a device under test (DUT), a probe platen mounted on the base machine on which to mount probes for the DUT, a microscope mounted on the base machine having a field of view on the DUT on the chuck, and a single laser, mounted with the microscope. The single laser supplies an output beam through the microscope optics on a beam line to the field of view of the microscope. The laser includes optics to selectively generate the output beam on the beam line in a plurality of wavelengths. A preferred system includes a solid state laser, a harmonic generator coupled with the solid state laser, and switchable optics for selecting the wavelength of the output beam from among two or more selectable wavelengths in the infrared, visible and ultraviolet ranges. Wavelengths, in this embodiment, may be selected from the fundamental wavelength of the laser and one of the harmonics, from among a plurality of harmonics of the laser, or from among the fundamental and a plurality of harmonics of the laser. In addition, the laser system includes a variable attenuator which operates for the plurality of wavelengths which are selectable as outputs. The variable attenuator is based on a novel half-wave plate, which provides for substantially half-wave phase retardation for the fundamental and the second, third and fourth harmonics.

The laser, according to one aspect of the present invention, comprises a passively air cooled, electro-optically Q-switched, Nd:YAG laser. One or more non-linear optics is mounted in the beam path to generate at least one harmonic of the fundamental wavelength. This laser provides a compact, vibration-free system which supplies output in the infrared (1064 nanometers), in the green (532 nanometers), and in the ultraviolet (355 nanometers, or 266 nanometers). These wavelengths correspond to the fundamental output wavelength of the Nd:YAG laser, the second harmonic, and either the third or fourth harmonic of the laser.

A variable attenuator is placed in the beam path for the plurality of wavelengths by which a user can control the power of all of the output wavelengths. Finally, switchable optics are included in the beam path to select the wavelength of the output beam from among the fundamental wavelength, and the plurality of harmonics. The switchable optics result in delivery of the output beam along the same beam line through the microscope, independent of the selected output.

When the fundamental output wavelength of the laser system is desired as an output selectable by the system, an additional problem occurs. In particular, the non-linear optics may cause walkoff of the fundamental wavelength. In this embodiment, an optic is included in the beam line which compensates for the walkoff, so that when selected, the fundamental wavelength is supplied on the beam line through the microscope.

Further, the switchable optics, according to the preferred laser system, include a plurality of filters mounted on a mechanism for switching a selected one of the plurality of filters into the beam path. As mentioned above, if the fundamental wavelength is desired for output, the filter which is used to select for the fundamental wavelength is mounted at a predetermined angle to the beam path to compensate for the walkoff. It is critical that the plural wavelengths in the IR, visible and UV used with the probe station are delivered consistently along a single beam line through the microscope optics and with controlled attenuation.

The variable attenuator, according to the present invention, provides for attenuation at all of the selectable wavelengths for the output beam. The variable attenuator includes a half-wave plate in the beam path which is tuned to the plurality of wavelengths. A polarizer is included, and a mechanism for rotating the wave plate to attenuate the plurality of wavelengths. The wave plate must be carefully designed to operate efficiently at all of the wavelengths desired for possible outputs.

The laser system, according to the present invention, is compact, vibration-free, and relatively inexpensive. One configuration, according to the present invention of the laser system, comprises a passively air-cooled, electro-optically Q-switched Nd:YAG laser, generating a beam at a fundamental wavelength along a beam path. A first, non-linear crystal is mounted in the beam path to generate a second harmonic of the fundamental wavelength. A second non-linear crystal is mounted in the beam path to generate at least one of a third and fourth harmonics of the fundamental wavelength. A variable attenuator is mounted in the beam path for the fundamental wavelength, the second harmonic, and at least one of the third and fourth harmonics. Finally, switchable optics in the beam path select the wavelength of the output beam from among the fundamental wavelength, the second harmonic, and at least one of the third and fourth harmonics. Two or three wavelength models of the present invention are 6.25 inches wide, 12 inches high, and 5 inches deep. The system weighs only 8 pounds.

Because of the compact size and vibration-free implementation, the laser according to the present invention can be mounted on a microscope to form a simple multi-wavelength laser cutter, as an alternative to the probe station embodiment discussed above.

The probe station and laser system, according to the present invention, meet the exacting requirements of semiconductor micromachining for design verification and evaluation, failure analysis, and LCD repair applications. The solid state, vibration-free, air-cooled system combines convenient operation, small size, superior uniformity and stability into a single instrument with unmatched performance. The multi-wavelength system provides optimum flexibility for a range of applications.

Other aspects and advantages of the invention can be seen upon review of the figures, the detailed description, and the claims which follow.

DETAILED DESCRIPTION

Figure 1:
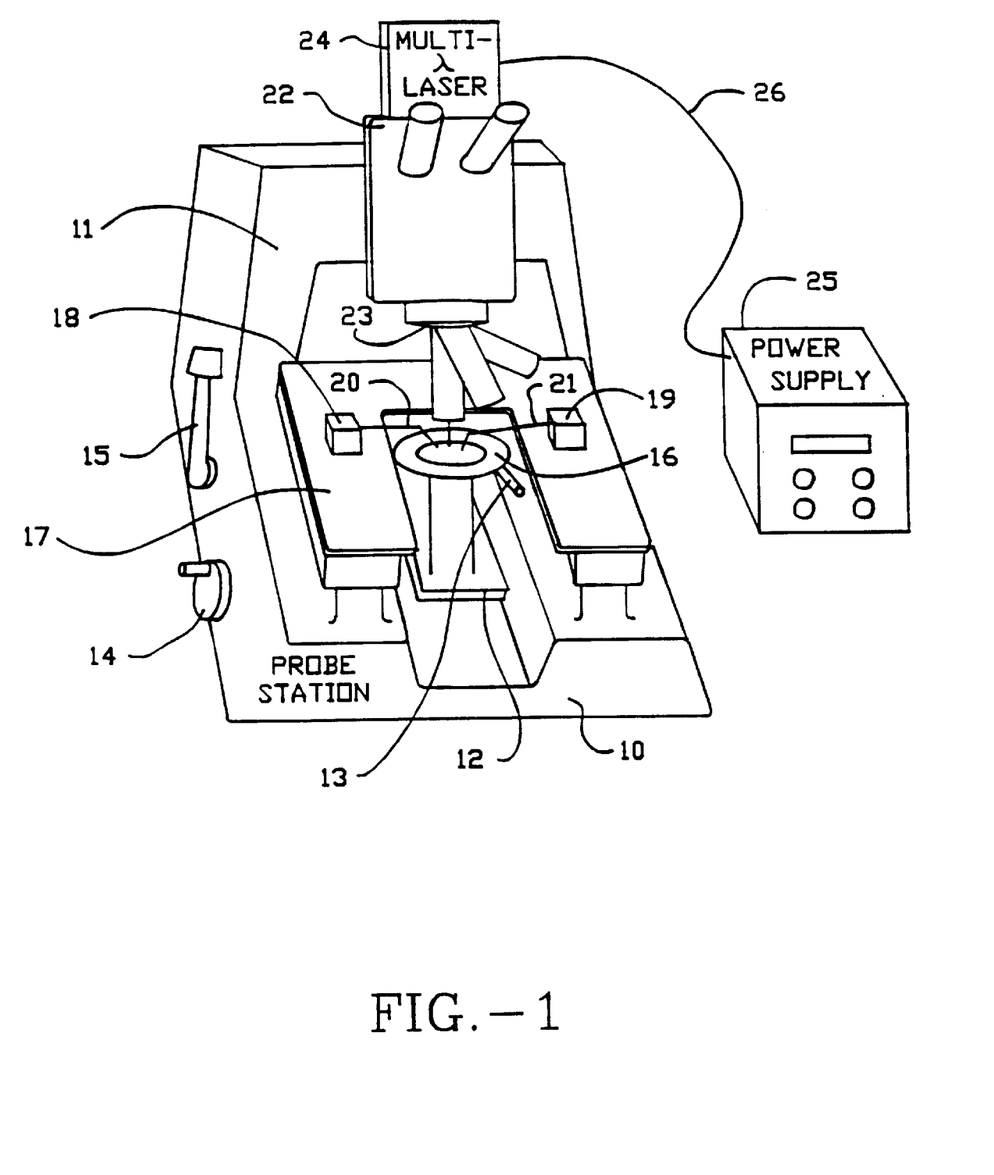
FIG. 1 is a perspective view of an analytical probe station with a multi-wavelength laser, according to the present invention.

A detailed description of preferred embodiments of the present invention is provided with reference to the figures, in which FIG. 1 illustrates a probe station according to the present invention with a multi-wavelength laser mounted thereon.

FIG. 1 provides a simplified diagram of an analytical probe station according to the present invention. One important feature of an analytical probe station is compact size to preserve valuable laboratory space. However, the stations are complex machines which are adapted to handle a wide variety of probing applications.

The probe stations consists of a base machine 10, typically including a base frame, a microscope mounting bridge 11, a translation stage 12 for X and Y adjustments, cables for probe heads and the like (not shown), a mechanism 13 for allowing rotation of a chuck, and other features known in the art. As illustrated in the figure, the base machine 10 includes a variety of controls, e.g., 14 and 15 used for configuring the probe station for a particular application.

Also included in the probe station are a chuck 16 with typically magnetic or vacuum powered attachments for holding a subject of the probe on the chuck 16. Adjacent the chuck is a platen 17 on which to position a plurality of probe heads 18, 19. The probe heads 18 are coupled to probe arms 26, 21 which extend onto the subject of the probe.

A microscope 22 is mounted on the microscope bridge 11. The microscope includes a plurality of objective lenses 23 as known in the art. Typically, the microscope 22 is a stereoscopic microscope, such as a the Mitutoyo FS-60 microscope, which is available through MTI Corporation in City of Industry, Calif.

According to the present invention, a multi-wavelength laser 24 is mounted with the microscope 22. The multi-wavelength laser 24 is compact, fitting right on the microscope, and does not waste expensive laboratory resources. The multi-wavelength laser 24 is coupled to a power supply 25 by which the parameters of the output beam are controlled. An electrical umbilical cord 26 is coupled between the power supply 25 and the multi-wavelength laser 24. The laser may be mounted on the camera port for the microscope, or on a dedicated laser port of some available microscopes. The beam is directed through the microscope and exits through the microscope objective into the field of view. The beam is focused into a small area determined by the objective lens used and the size of a variable aperture in the laser head. High power objectives focus the beam into smaller areas than lower powered objectives and create enough energy density to melt or vaporize many materials. A 100x objective will generate four times the energy density of a 50x objective. A 20x objective produces only 16% of the energy density of a 50x objective.

Microscopes are generally designed for visible light and, as such, the energy of visible light lasers are most easily transmitted through the microscope optics. Many microscope manufacturers offer infrared versions of their microscope which transmit, in addition to visible light, near infrared energy. Some microscope manufacturers are also developing microscopes which will transmit near UV energy in addition to visible light.

According to the preferred embodiment, the multi-wavelength laser head has dimensions of approximately 12 inches high by 6.25 inches wide by 5 inches deep including a camera adaptor. It consists of a passively air-cooled, Nd:YAG laser, optics in the beam path of the laser for generating a plurality of harmonics of the fundamental wavelength, a variable attenuator operable for all the selectable output wavelengths, and switchable optics which are used to select the output wavelength upon operation of a switch. The laser system is electro-optically Q-switched and operates at 1 Hz continuously or a single shot may be fired on demand. All the plurality of wavelengths are supplied along a single beam line into the microscope optics, so that they are consistently positioned in the field of view of the microscope on the subject of the probe station. In addition, the laser system includes a variable XY shutter, so that the output beam has a controlled size rectangular footprint on the subject DUT. The laser head uses an invar stabilized resonator cavity on which the optics of the laser are mounted. This insures trouble free operation under normal operating conditions. The flash lamp and power supply are passively air-cooled without the use of fans, or other active cooling mechanisms. This prevents vibration at the probe station which is critical for probing semiconductor devices and the like which may have submicron dimensions.

Figures 2A, 2B:
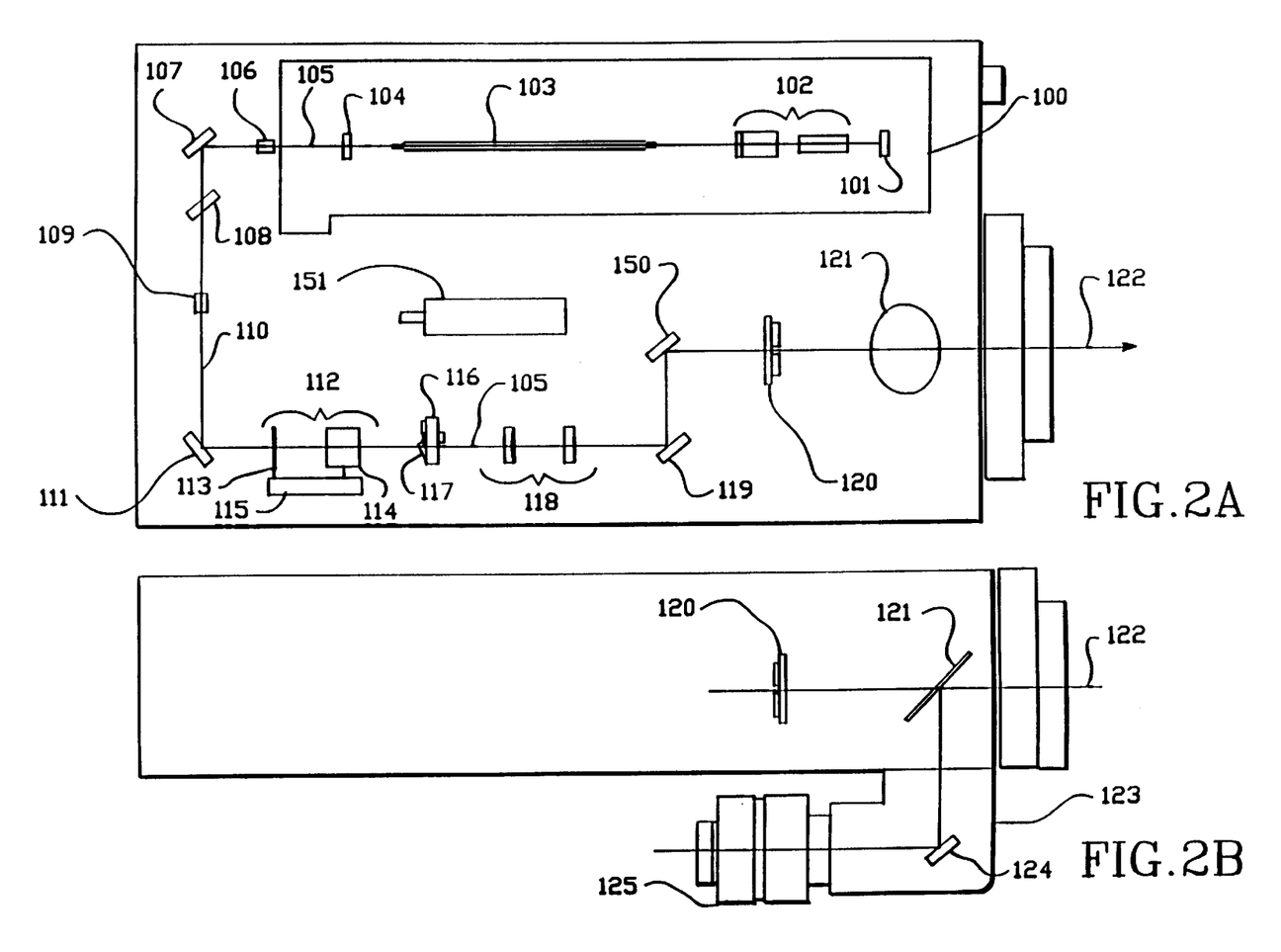
FIGS. 2A and 2B illustrate the layout of a multi-wavelength laser, according to a first embodiment of the present invention.

A layout of the optical design of the laser system in the preferred embodiment is described in FIGS. 2A and 2B. The laser system includes a flash lamp pumped electro-optically Q-switched Nd:YAG laser 100, such as the commercially available ACL-1 air-cooled laser available from the Assignee of the present application, New Wave Research, Inc., of Sunnyvale, Calif. This system includes an invar stabilized, electro-optically Q-switched and passively air cooled laser resonator. The laser 100 includes a high reflector 101 electro-optic Q-switch 102, a flash lamp pumped Nd:YAG gain medium 103, and an output coupler 104. The output of the laser 100 is supplied along beam path 105 through a first non-linear crystal 106 for generating the second harmonic of the fundamental output wavelength of the laser 100. In the preferred system, this non-linear crystal is KTP aligned for frequency doubling the 1064 nanometer line of the YAG laser. Next in the beam path 105 is a high reflecting mirror 107 for the fundamental and second harmonic wavelengths. The mirror 107 directs the beam path at a 90° angle through a polarizer 108 to repolarize the fundamental wavelength of the laser 100. The fundamental wavelength is repolarized after the doubling crystal 106 for more efficient attenuation. The repolarized fundamental frequency and frequency doubled component are then passed along the beam path 105 through a second non-linear crystal 109. The second non-linear crystal 109, in the preferred system, is used for generating the third harmonic and the fourth harmonic of the fundamental wavelength. In this embodiment, it consists of beta barium borate BBO aligned for either the third or fourth harmonic generation.

The fundamental, the second harmonic, and the third or fourth harmonics are then passed along the beam path 110 to a high reflecting mirror 111, which is high reflecting at the fundamental wavelength, the second harmonic, the third harmonic, and the fourth harmonic. The mirror 111 turns the beam 90° through a variable attenuator 112.

The variable attenuator 112 consists of a multiple wavelength wave plate 113 and a calcite polarizer 114. The relative angular position of these two devices is controlled using a mechanism 115 known in the art so as to control attenuation of the laser beam on path 105.

The multiple wavelength wave plate operable at each of the four wavelengths identified must have an optical thickness which is near an odd number of one-half wavelengths of all of the wavelengths of interest. It has been discovered that an optical grade crystalline quartz plate having a physical thickness of near 0.77901 millimeters, provides about 180 degrees relative phase retardation of the e- and o- waves for each of the fundamental, the second harmonic, the third harmonic and the fourth harmonic (1064, 532, 355, 266 nm). This corresponds with the 63rd order half-wave at the 266 nanometers of the fourth harmonic. Although the relative phase retardation is not precisely half-wave for all four wavelengths, it is close enough that when combined with a polarizer, an attenuator is formed which is effective at all four. In the embodiment describe, the attenuator transmission when open is about 100% for the fourth harmonic, about 99.4% for the third harmonic, about 98.6% for the second harmonic and about 89.3% for the fundamental. Other thicknesses for the half-wave plate can be used to achieve similar results, but this is preferred because of the higher transmission in lower power wavelengths of the second, third and fourth harmonics. For instance, a thickness of about 0.0865 millimeters is about 100% transmissive at 266, 89% at 355, 100% at 532 and 62% at 1064. A thickness of about 0.3091 millimeters is about 100% transmissive at 266, 98% at 355, 77% at 532 and 99% at 1064. A thickness of about 0.5564 millimeters is about 100% transmissive at 266, 85% at 355, 87% at 532 and 96% at 1064. A thickness of about 0.9274 millimeters is about 100% transmissive at the fifth harmonic (213 nanometers), about 100% transmissive at 266, 85% at 355 and 88% at 1064, although it is not transmissive at the second harmonic. For single plate half-wave plates, it is desirable to keep the thickness below about 1 millimeter to avoid incurring thermal problems associated with thicker plates.

The attenuated beam is supplied on path 105 out of the variable attenuator 112 through a switchable filter mechanism 116. The switchable filter mechanism mounts a plurality of filters used for selecting the output wavelength of the system. By moving one of the plurality of wavelength selective filters into the beam path, the output wavelength is selected.

Then non-linear crystals 109 for generating the third or fourth harmonic cause walkoff of the harmonic wavelengths, so that they are separated from the beam path 105 by an amount of about one-half of a millimeter. This walkoff is critical for the microscope mounted laser system where the output beam must proceed along the same beam line for all the selected wavelengths into the field of view of the microscope.

By tilting filter 117 which is used to select the third or fourth harmonic wavelengths, this walkoff is corrected. Thus, the third or fourth harmonic wavelengths, and the other wavelengths are supplied along the beam path 105 in alignment, independent of which wavelength is selected. In an alternative system, one could tilt the filter for the fundamental or second harmonic to realign the beam with the third of fourth harmonic.

The KTP crystal 106 aligned for second harmonic generation causes negligible walkoff. Thus, the BBO crystal 109 is primarily responsible for the walkoff which must be corrected by the switchable optics 116, using tilted colored glass filters which select for the desired output.

Next in the beam path 105 is telescope 118. This telescope is used to expand the beam about three times from about a 3 millimeter cross-section to about a 9 millimeter cross-section. This allows for matching the cross-section of the beam with the controllable X-Y aperture 120 described below. After the telescope 118, the beam is supplied along the path 105 to a high reflector 119, which is reflective of the four selectable output wavelengths. The beam is turned at reflector 119 by 90°, to reflector 150. Reflector 150 is reflective at the harmonic wavelengths, and at the second, third, and fourth harmonics of the harmonic wavelengths. Also, it is transmissive at 600 nanometers and above in the embodiment described so that visible light is transmitted from a white light source 151 into the beam line such as a 150 watt white lamp, to act as an aiming beam or a spot marker.

The reflector 150 turns the beam path through an X-Y aperture 120 which is used to form a square or rectangular cross-section for the beam being delivered to the microscope.

The beam passes from aperture 120 to beam splitter 121. The beam splitter 121 is 50% or more transmissive at all of the four wavelengths selectable by the output system. The output of the laser system is then supplied on the beam line 122 into the microscope optics and on a line perpendicular to the drawing in FIG. 2A to a camera adapter 123, as shown in FIG. 2B. An image from the field of view of the microscope is reflected at beam splitter 121 to mirror 124 in the camera adapter 123. The camera adapter includes a fitting 125 to which a video camera or other imaging system may be coupled to the assembly.

The laser layout illustrated in FIGS. 2A and 2B is capable of providing three selectable output wavelengths with the flip of a switch for a probe station or laser cutter, according to the present invention. By tuning the non-linear crystal 109 to select for either the third or fourth harmonics, the laser system can be adapted to select for fundamental output wavelength in the infrared, the second harmonic in the visible, or the third harmonic in the ultraviolet, or to select for the fundamental output wavelength in the infrared, the second harmonic in the visible, or the fourth harmonic in the ultraviolet.

The variable attenuator 112 and the switchable optics 116 are especially designed to overcome the problems associated with multi-wavelength laser systems which must supply controlled attenuation outputs, on a single beam line with the exacting standards of probe stations or laser cutters.

Because the optics, including attenuator 112, and high reflectors 111, 119 and 150, work for all four possible wavelengths, the laser system of FIG. 2A can be extended to a four wavelength system by inserting an additional nonlinear crystal in series with crystal 109. Any changes in the walkoff of the beam are compensated by adjusting the tilts of the filters as before.

Figure 3A:
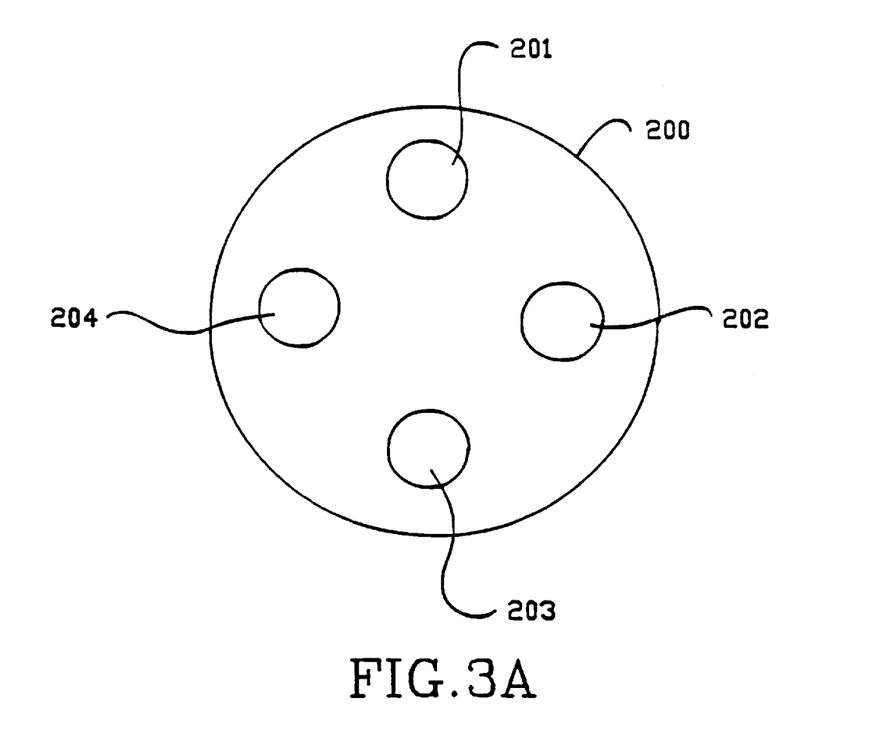
FIGS. 3A and 3B illustrate the mechanism for moving filters in and out of the beam path in the optical layouts of FIGS. 2A, 2B and 4.
Figure 3B:
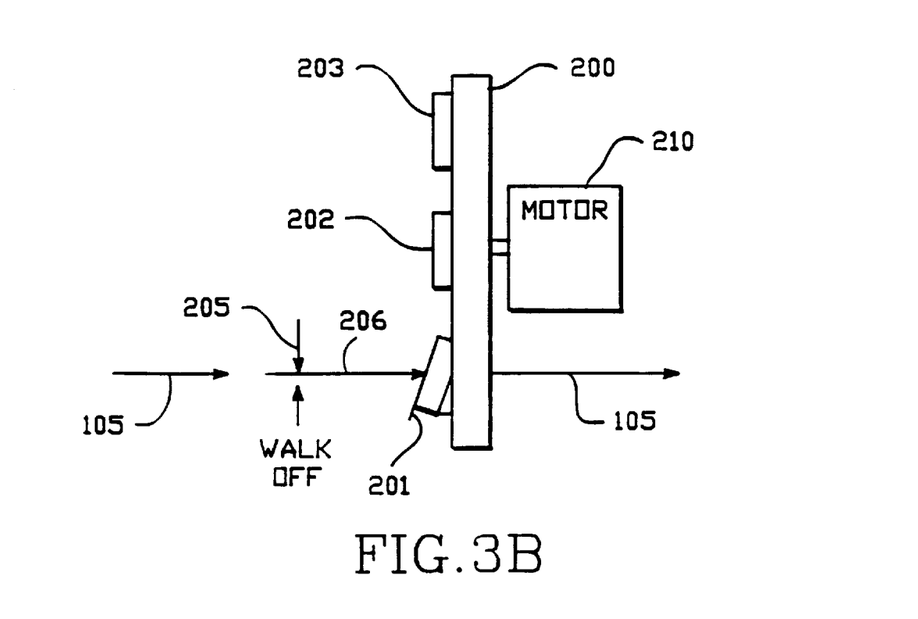

A simplified diagram of the switchable optics, according to the present invention, is provided in FIGS. 3A and 3B. FIG. 3B illustrates a wheel 200 on which a plurality of filters 201, 202, 203 and 204 are mounted. Each filter consists of a colored glass filter designed to select for a particular output wavelength. Alternatively, a plurality of the filters on the wheel might select for the same wavelength but provide for different amounts of attenuation of that wavelength. Thus, filters 201 and 202 might select for the third and second harmonics of the harmonic wavelengths respectively. Filters 203 and 204 might select for the fundamental output wavelength with a 70% attenuation and a 50% attenuation, respectively. The wheel can be expanded to hold a larger number of filters, as needed. Also, more than one wheel in series may be used to accomplish a variety of effects.

In order to correct for walkoff, the filter 201 which selects for the third or fourth harmonic wavelengths is mounted with a tilt. FIG. 3B illustrates a side view of the selectable optic mechanism which includes a wheel 200. The wheel 200 is mounted with a motor 210 for selecting the position of the filter. Filters 202, 203 and 204 are mounted flat to pass the fundamental and second harmonic wavelengths straight through when the appropriate filter is in the beam path 105. However, the filter 201 is mounted with a tilt to compensate for the walkoff 205 of the third or fourth harmonic wavelengths on path 206. In the preferred system, a colored glass filter having a thickness of 2.5 millimeters, tilted at approximately 18° is used to compensate for the walkoff caused by a BBO crystal aligned for generation of the third harmonic. When the BBO crystal is aligned for the fourth harmonic, the angle of tilt of the filter is approximately 20°.

For a system which is designed to supply an ultraviolet output wavelength (355 or 266 nanometers), the optics of most commercial microscopes must be replaced with UV transmissive optics. Thus, the Mitutoyo FS-60 microscope must be fitted with a beam splitter prism and zoom lens attachment made of fused silica which transmits all of the wavelengths of interest. An objective lens which is transmissive of the UV is available commercially from the manufacturer of the Mitutoyo microscope.

The KTP and BBO crystals may be replaced with a wide variety of non-linear crystals, as known in the art. However, KTP is quite efficient for frequency doubling the 1064 nanometer line of the Nd:YAG laser. Also, the doubling occurs with an alignment of almost 90° so that the walkoff is negligible. The BBO crystal is used for third or fourth harmonic generation.

Figure 4:
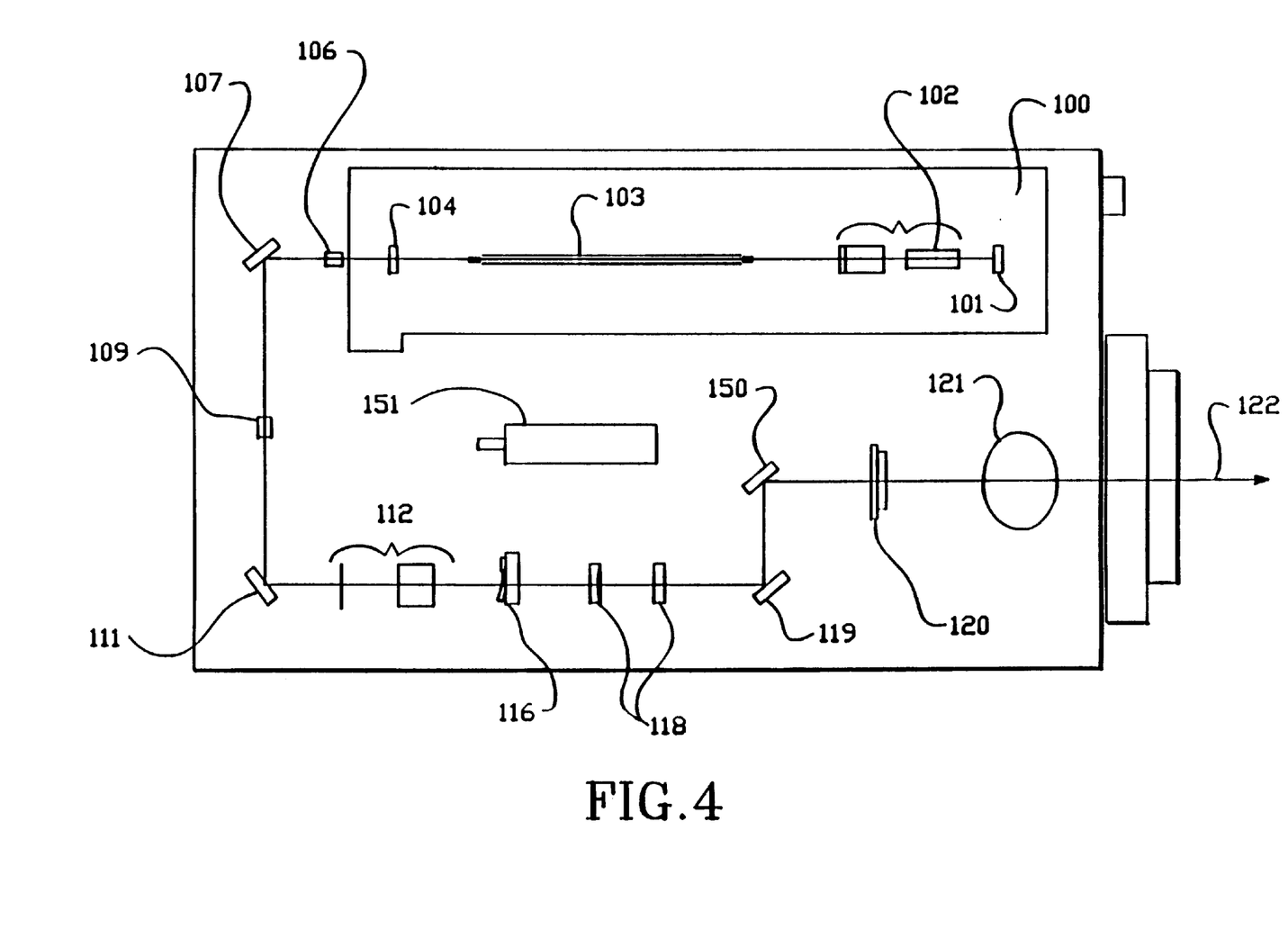
FIG. 4 illustrates the optical layout of an alternative laser design according to the present invention.

FIG. 4 illustrates an alternative layout for a laser system generating the second and third harmonics of the harmonic wavelengths for selection. In this system, components which are similar to those used in the embodiment of FIG. 2A are given like reference numbers and are not redescribed here.

As can be seen, the layout is similar to that shown in FIG. 2A, except that the repolarizer 108 for the harmonic wavelengths is eliminated. Also, the attenuator 112 need only be operable at the two selectable wavelengths. Also, the crystal 109 can be tuned for either third or fourth harmonic generation, as before.

The spot marker 151 in this embodiment is also a white light source. However, as known in the art, this spot marker may be replaced with laser diode or other aim beam technologies.

Figure 5:
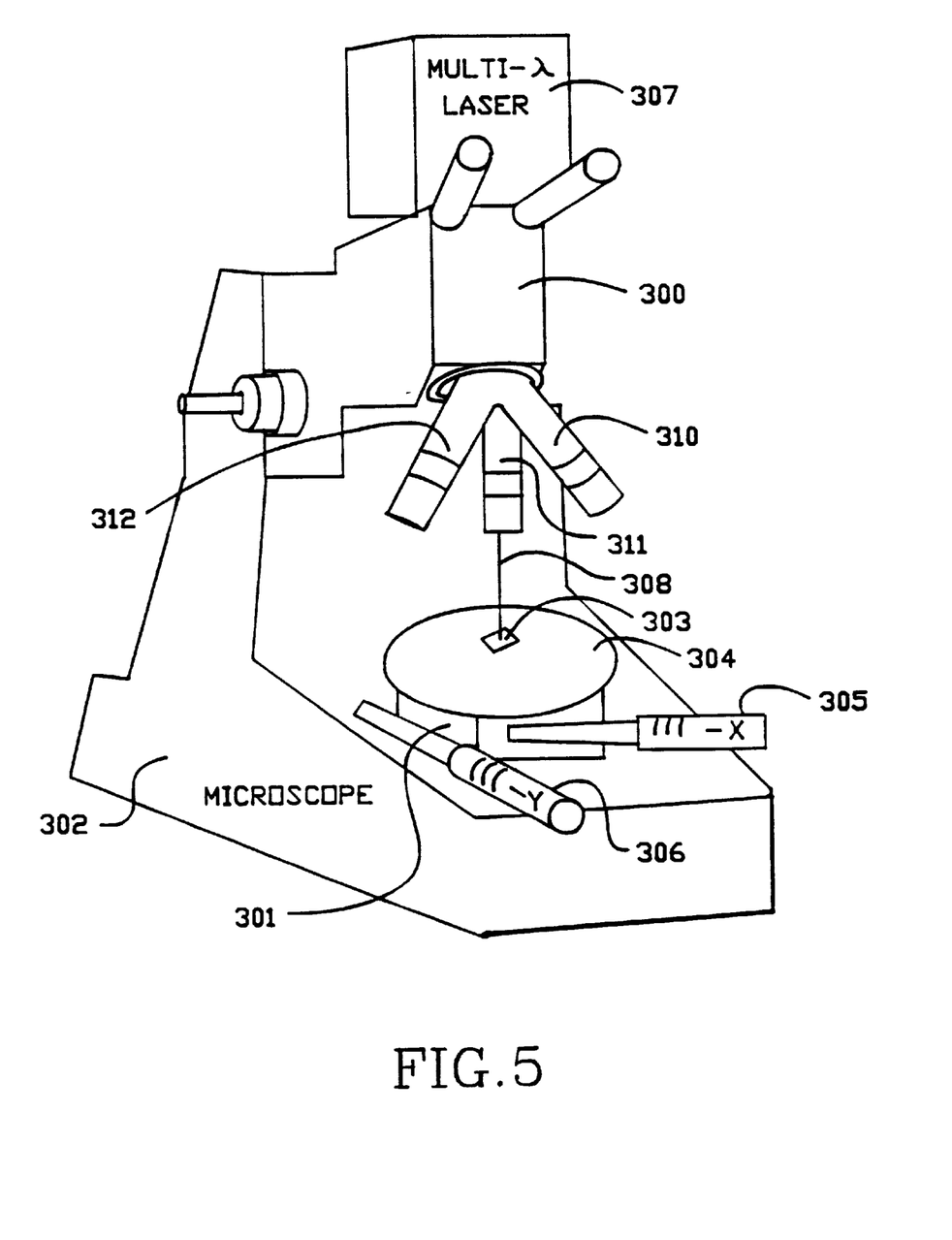
FIG. 5 is a perspective view of a laser cutter system consisting of a microscope with a multi-wavelength laser mounted thereon according to the present invention.

FIG. 5 illustrates the multi-wavelength laser system according to the present system mounted on a simple laser cutter mechanism which includes a microscope 300, and a stage 301 mounted on a microscope base 302. The microscope 300 has a field of view 303 on a subject 304 of the laser cutting operation. The stage 301 includes fine X and Y micrometer stages 305, 306 for controlling the position of the subject 304 of the laser cutter operation.

The multi-wavelength laser 307 supplies a selectable output wavelength on the beam line 308 into the field of view 303 of the laser. The beam line 308 does not change when the output wavelength of the laser 307 changes under operation of the system as described above. The microscope 300 includes a plurality of objective lenses 310, 311, and 312 all of which are adapted to pass the plurality of wavelengths which are generated by the multi-wavelength laser 307. Further, the microscope optics, including prisms and the like, are transmissive at all the plurality of wavelengths selected by the laser system.

The compact size of the laser system 307 is critical for the probe station or laser cutter application as described above. The multi-wavelength laser 307, as shown in FIG. 5, is small enough to mount on a microscope, stable enough so that the output wavelengths are consistently generated along a single beam line 308, and light enough that it does not upset the focusing mechanism of the microscope. Further, the laser system does not use valuable laboratory space to produce a plurality of wavelengths.

In addition, the laser multi-wavelength laser 307 is applicable in a variety of other situations which require compact, stable, multi-wavelength systems. Unique ability to provide a plurality of controlled attenuation outputs along a single beam line using a single laser and specially designed optics, allows application of multi-wavelength lasers in a variety of environments not available before because of the expense and bulk of prior art multi-wavelength systems.

Accordingly, the present invention provides an air-cooled, pulsed, Nd:YAG laser system designed to be mounted on a stand alone microscope, or a probe station. A higher repetition-rate system could be water cooled. Mounted on an analytical probe station, the system provides unique flexibility for semiconductor design verification and failure analysis applications. In the stand alone laser cutter system, the laser is mounted on a microscope with its own stand and X-Y stage, making it available for a larger number of engineers than would have access to the standard probe station.

The system provides many advanced features, including electro-optic Q-switch, multiple wavelength operation, fanless operation, and compact size. Output is stable and repeatable, which insures precise cutting and allows for large uniform cuts. The invar stabilized resonator structure improves temperature stability, which makes the laser system more tolerant of temperature changes and allows it to have consistent energy over a broader temperature range.

The electro-optic Q-switch in the preferred embodiment uses a KDP crystal in the Pockel cell and polarizer, which allows for precise control of the energy burst from the gain medium.

The unique half-wave plate and dielectric polarizer of the variable attenuator are not subject to heat buildup, deformation, and energy variations, which might be experienced by lower cost attenuators. Also, they provide attenuation over the entire spectrum of output wavelengths generated by the laser system.

The present invention provides, for the first time, the ability to mount a single laser on a probe station or laser cutter, which provides outputs selectable from the infrared, the visible, and the ultraviolet ranges. The outputs are available with precisely controlled attenuation, and proceed along a single beam line through the microscope for consistent operation. The compact size and air-cooled nature make it ideally suited to the probe station environment, where laboratory space is at a premium and vibration cannot be tolerated.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A half-wave plate having an optical thickness adapted to output at least three wavelengths selected from a group consisting of a fundamental wavelength of about 1064 nanometers, a second harmonic of the fundamental wavelength, a third harmonic of the fundamental wavelength and a fourth harmonic of the fundamental wavelength.

2. The half-wave plate of claim 1, wherein the half-wave plate has an optical thickness of about a 63rd order half-wave for the fourth harmonic of the fundamental wavelength.

3. The half-wave plate of claim 1, wherein the half-wave plate has a physical thickness equal to or less than about 1 millimeter.

4. The half-wave plate of claim 1, wherein the half-wave plate functions as a half-wave plate for the fundamental wavelength, the second harmonic of the fundamental wavelength, and the third harmonic of the fundamental wavelength.

5. The half-wave plate of claim 1, wherein the half-wave plate functions as a half-wave plate for the fundamental wavelength, the second harmonic of the fundamental wavelength, and the fourth harmonic of the fundamental wavelength.

6. The half-wave plate of claim 1, wherein the half-wave plate functions as a half-wave plate for the fundamental wavelength, the second harmonic of the fundamental wavelength, the third harmonic of the fundamental wavelength and the fourth harmonic of the fundamental wavelength.

7. The half-wave plate of claim 1, wherein the half-wave plate has a physical thickness of about 0.779 millimeters.

8. A half-wave plate consisting of a single plate of crystalline quartz having a physical thickness selected from a group consisting of about 0.0865 millimeters, 0.3091 millimeters, 0.5564 millimeters, 0.779 millimeters, and 0.9274 millimeters which functions as a half-wave plate for at least three wavelengths selected from a group consisting of a fundamental wavelength of about 1064 nanometers, a second harmonic of the fundamental wavelength, a third harmonic of the fundamental wavelength and a fourth harmonic of the fundamental wavelength.

9. A half-wave plate having an optical thickness which induces a relative phase difference of about 180 degrees between an e-wave and an o-wave of a fundamental wavelength, a second harmonic, a third harmonic and a fourth harmonic of the fundamental wavelength.

10. The half-wave plate of claim 9, wherein the optical thickness of the half-wave plate is about a 63rd order half-wave of the fourth harmonic.

11. The half-wave plate of claim 9, wherein the fundamental wavelength is about 1064 nanometers, and the half-wave plate has a physical thickness of about 0.779 millimeters.

12. The half-wave plate of claim 9, wherein the half-wave plate has a thickness equal to or less than about 1 millimeter.

13. The half-wave plate of claim 1, wherein the half-wave plate comprises a crystalline quartz plate.

14. The half-wave plate of claim 11, wherein the half-wave plate comprises a crystalline quartz plate.

15. The half-wave plate of claim 12, wherein the half-wave plate comprises a crystalline quartz plate.

* * * * *